US006886143B1

(12) United States Patent
Park

(10) Patent No.: US 6,886,143 B1
(45) Date of Patent: Apr. 26, 2005

(54) METHOD AND APPARATUS FOR PROVIDING CLOCK/BUFFER NETWORK IN MASK-PROGRAMMABLE LOGIC DEVICE

(75) Inventor: Jonathan Park, San Jose, CA (US)

(73) Assignee: Altera Corporation, San Jose, CA (US)

( * ) Notice: Subject to any disclaimer, the term of this patent is extended or adjusted under 35 U.S.C. 154(b) by 365 days.

(21) Appl. No.: 10/113,328

(22) Filed: Mar. 29, 2002

(51) Int. Cl.⁷ ............................................. G06F 17/50
(52) U.S. Cl. ......................................... 716/2; 716/17
(58) Field of Search ................................ 716/2, 17, 13, 716/16; 326/41

(56) References Cited

U.S. PATENT DOCUMENTS

| | | | |
|---|---|---|---|
| 5,068,603 A | 11/1991 | Mahoney | 324/158 R |
| 5,212,652 A | 5/1993 | Agrawal et al. | 364/489 |
| 5,815,405 A | 9/1998 | Baxter | 364/489 |
| 5,825,202 A | 10/1998 | Tavana et al. | 326/39 |
| 5,874,834 A | 2/1999 | New | 326/39 |
| 5,889,412 A * | 3/1999 | Shimanek et al. | 326/39 |
| 5,971,595 A * | 10/1999 | Grant et al. | 716/3 |
| 6,091,262 A | 7/2000 | New | 326/39 |
| 6,094,065 A | 7/2000 | Tavana et al. | 326/39 |
| 6,111,756 A * | 8/2000 | Moresco | 361/735 |
| 6,150,837 A * | 11/2000 | Beal et al. | 326/39 |
| 6,177,844 B1 | 1/2001 | Sung et al. | 331/25 |
| 6,219,819 B1 * | 4/2001 | Vashi et al. | 716/3 |
| 6,242,945 B1 | 6/2001 | New | 326/39 |
| 6,297,666 B1 * | 10/2001 | Weingartner et al. | 326/41 |
| 6,311,316 B1 | 10/2001 | Huggins et al. | 716/12 |
| 6,490,707 B1 | 12/2002 | Baxter | 716/2 |
| 6,515,509 B1 | 2/2003 | Baxter | 326/39 |
| 6,526,563 B1 | 2/2003 | Baxter | 716/18 |
| 6,624,056 B2 * | 9/2003 | Chandna et al. | 438/586 |

OTHER PUBLICATIONS

Xilinx, *HardWire Data Book*, "XC3300 Family HardWire Logic Cell Arrays," Preliminary Product Specification, 1991.
Xilinx, HardWire Data Book, pp. 1–1 through 2–28, 1994.

* cited by examiner

*Primary Examiner*—Stacy A. Whitmore
(74) *Attorney, Agent, or Firm*—Fish & Neave LLP; Jeffrey H. Ingerman

(57) ABSTRACT

A mask-programmable logic device includes a "dedicated" device-wide distribution network for device-wide signals such as clocks. Distribution networks for secondary clocks and similar signals, as well as for other high-fanout signals, are designed on a custom basis for each user configuration to be implemented by mask programming, using design techniques that are well known in application-specific integrated circuit design. This accomplishes, at the same time, elimination of the need to custom design the device-wide distribution network for each user configuration, preservation of the timing characteristics of a comparable conventional programmable logic device on which the user configuration may be based, reduction of die-size and power requirements as compared to the comparable conventional programmable logic device, and reduction of the average design time necessary to implement a given user configuration.

36 Claims, 5 Drawing Sheets

METHOD AND APPARATUS FOR PROVIDING CLOCK/BUFFER NETWORK IN MASK-PROGRAMMABLE LOGIC DEVICE

BACKGROUND OF THE INVENTION

This invention relates to the provision of a clock/buffer network in a mask-programmable logic device. More particularly, the invention relates to such a device in which a portion of the clock/buffer network is fixed, and a portion of the clock/buffer network is mask-programmable.

Programmable logic devices are well known. Early programmable logic devices were one-time configurable. For example, configuration may have been achieved by "blowing"—i.e., opening—fusible links. Alternatively, the configuration may have been stored in a programmable read-only memory. These devices generally provided the user with the ability to configure the devices for "sum-of-products" (or "P-TERM") logic operations. Later, such programmable logic devices incorporating erasable programmable read-only memory (EPROM) for configuration became available, allowing the devices to be reconfigured.

Still later, programmable logic devices incorporating static random access memory (SRAM) elements for configuration became available. These devices, which also can be reconfigured, store their configuration in a nonvolatile memory such as an EPROM, from which the configuration is loaded into the SRAM elements when the device is powered up. These devices generally provide the user with the ability to configure the devices for look-up table-type logic operations. At some point, such devices began to be provided with embedded blocks of random access memory that could be configured by the user to act as random access memory, read-only memory, or logic (such as P-TERM logic).

In all of the foregoing programmable logic devices, both the logic functions of particular logic elements in the device, and the interconnect for routing of signals between the logic elements, were programmable. More recently, mask-programmable logic devices have been provided. With mask-programmable logic devices, instead of selling all users the same device, the manufacturer manufactures a partial device with a standardized arrangement of logic elements whose functions are not programmable by the user, and which lacks any routing or interconnect resources.

The user provides the manufacturer of the mask-programmable logic device with the specifications of a desired device, which may be the configuration file for programming a comparable conventional programmable logic device. The manufacturer uses that information to add metallization layers to the partial device described above. Those additional layers program the logic elements by making certain connections within those elements, and also add interconnect routing between the logic elements. Mask-programmable logic devices can also be provided with embedded random access memory blocks, as described above in connection with conventional programmable logic devices. In such mask-programmable logic devices, if the embedded memory is configured as read-only memory or P-TERM logic, that configuration also is accomplished using the additional metallization layers.

While conventional programmable logic devices allow a user to easily design a device to perform a desired function, a conventional programmable logic device invariably includes resources that may not be used for a particular design. Moreover, in order to accommodate general purpose routing and interconnect resources, and the switching resources that allow signals from any logic element to reach any desired routing and interconnect resource, conventional programmable logic devices grow ever larger as more functionality is built into them, increasing the size and power consumption of such devices. The routing of signals through the various switching elements as they travel from one routing and interconnect resource to another also slows down signals.

The advent of mask-programmable logic devices has allowed users to prove a design in a conventional programmable logic device, but to commit the production version to a mask-programmable logic device which, for the same functionality, can be significantly smaller and use significantly less power, because the only interconnect and routing resources are those actually needed for the particular design. In addition, there are no general purpose switching elements consuming space or power, or slowing down signals.

On the other hand, conventional programmable logic devices are optimized for the distribution of device-wide signals such as clocks. Networks of device-wide conductors are located and routed to predetermine insertion delay and minimize skew in such device-wide signals, which becomes more significant as devices grow larger and more complex, so that on average the distribution network for such device-wide signals is as efficient as it can be. In addition, the general routing and interconnect resources in conventional programmable logic devices include additional device-wide conductors for other high-fanout signals, such as presets, clears, enables and other signals that may be generated in the user-designed logic such as high-fanout logic outputs. These resources, which give the user a way to efficiently distribute device-wide signals, are also frequently provided with generous buffering resources, to prevent degradation of such signals as a result of capacitive or other loading of the device-wide conductors.

However, in mask-programmable logic devices as described above, there are no predetermined routing resources. Therefore, the task of optimizing each design falls to the manufacturer in migrating the user's programmable device design to a mask-programmable device. This task can be very time consuming, and can greatly slow down the process of migrating the design. Accordingly, it would be desirable to be able to provide a mask-programmable logic device which preserves the timing characteristics of the conventional programmable logic device to which it is comparable, for which the time required to design any required high-fanout signal routing can be minimized, and whose die-size and power requirements are reduced as compared to the comparable conventional programmable logic device.

SUMMARY OF THE INVENTION

It is an object of the present invention to provide a mask-programmable logic device which preserves the timing characteristics of the conventional programmable logic device to which it is comparable, for which the time required to design any required high-fanout signal routing can be minimized, and whose die-size and power requirements are reduced as compared to the comparable conventional programmable logic device.

These and other objects of the invention are accomplished in accordance with the principles of the invention by providing a mask-programmed logic device including a mask-programmable base device having an array of mask-programmable logic regions, a plurality of input/output areas, and a plurality of drivers for a device-wide network for distribution of device-wide signals among said logic regions and said input/output areas. The mask-programmed device further includes programming metallization layers that (a) program the mask-programmable logic regions of the base device, (b) connect the plurality of drivers to form the device-wide network, and (c) provide interconnections between and among the mask-programmed logic areas and the input/output areas. The interconnections provided by the programming metallization layers include routing for high-fanout signals. The device-wide network is optimized for the base device, independent of programming, to predetermine insertion delay and minimize skew of said device-wide signals, while the routing for high-fanout signals is optimized for the device as programmed by the programming metallization layers.

The base device and a method of programming the base device are also provided.

BRIEF DESCRIPTION OF THE DRAWINGS

The above and other objects and advantages of the invention will be more apparent upon consideration of the following detailed description, taken in conjunction with the accompanying drawings, in which like reference characters refer to like parts throughout, and in which.

DETAILED DESCRIPTION OF THE INVENTION

The present invention allows mask-programmable logic devices to be programmed with minimized delay and skew of clocks and similar signals (e.g., presets, clears, etc.), as well as high-fanout signals (e.g., logic outputs used widely throughout the device) by providing on the unprogrammed mask-programmable device the components necessary for a "dedicated" device-wide network for device-wide, while leaving the creation of networks for secondary clocks and similar signals, as well as high-fanout signals, to the programming phase in which metallization layers are designed and deposited to program the mask-programmable device for its user configuration. The dedicated device-wide network is designed to predetermine insertion delay and minimize skew of device-wide clocks in a manner that is well known in the manufacture of conventional programmable logic devices. Such a dedicated clock network is shown, for example, in commonly-assigned U.S. Pat. No. 6,177,844, which is hereby incorporated by reference in its entirety. The distribution networks for secondary signals, and high-fanout signals, are designed for the particular user implementation, in a manner similar to that used in designing application-specific integrated circuits ("ASICs"), and "programmed" into the mask-programmable device as part of the metallization layers that are used (a) to program the programable logic regions, (b) to connect the components of the device-wide network, and (c) to provide the interconnections between different ones of the programmable logic regions and between those regions and the input/output regions. This approach strikes a balance between, on the one hand, trying to custom-design the distribution networks for all of the clocks and high-fanout signals, and, on the other hand, trying to design dedicated networks that could be used for secondary clocks and similar signals, as well as for high-fanout signals, in a user configuration that is not known in advance. The former approach could consume weeks if not months in many, if not most, cases, which would be commercially unacceptable because users would not be content to wait so long for design and delivery of mask-programmed devices. The latter approach could consume excessive device resources and nevertheless result in inefficient, skewed distribution networks because the user configuration may not coincide with the layout of the dedicated networks, so that signals could be forced to travel unnecessarily long distances and, more significantly, the same signal could be forced to travel substantially different distances to different destinations.

The invention will now be described with reference to FIGS. 1–5.

Figure 1:
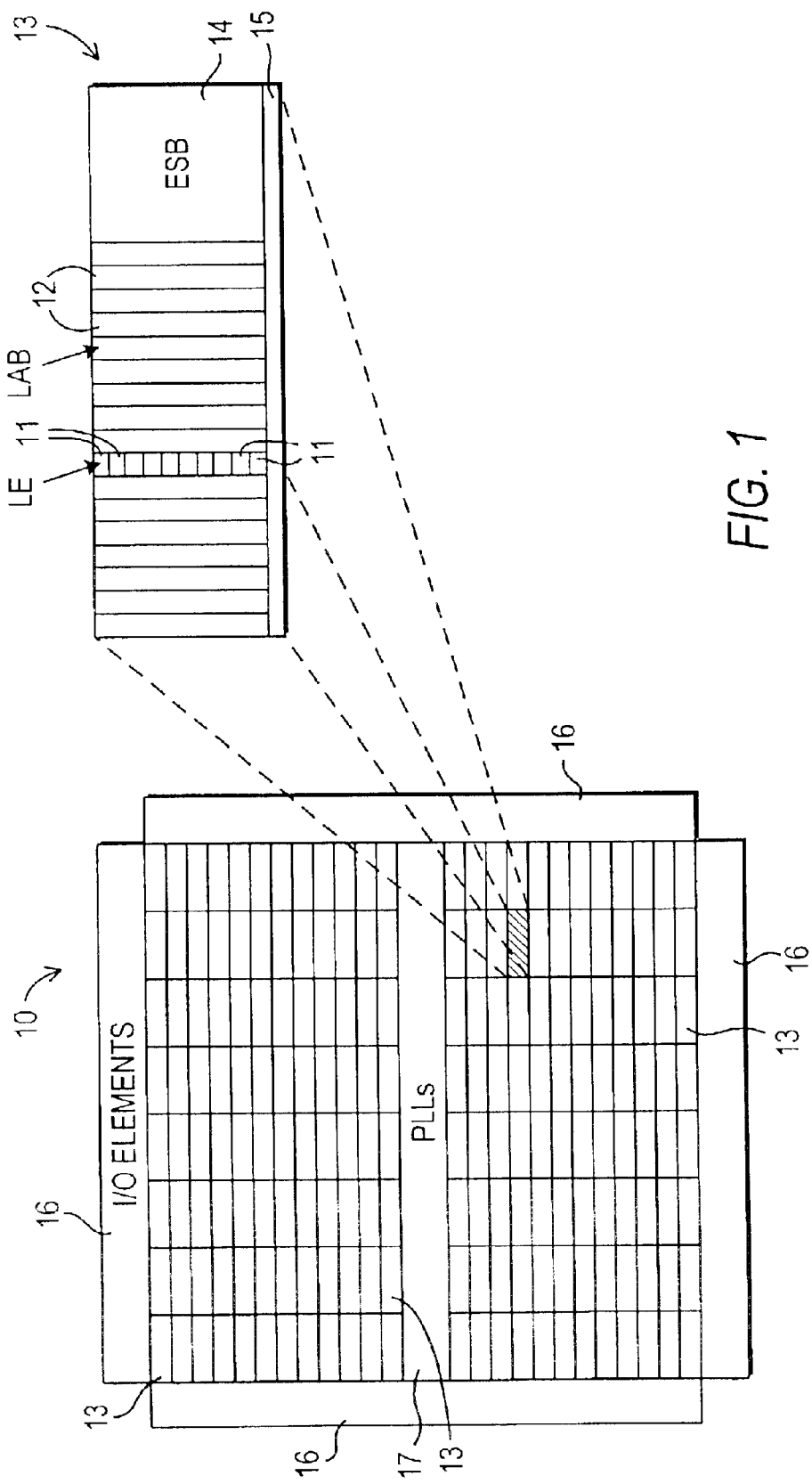
FIG. 1 is a schematic representation of the layout of a preferred embodiment of a mask-programmable logic device in accordance with the present invention.

As seen in FIG. 1, one preferred embodiment of a mask-programmable logic device 10 in accordance with the present invention includes an array of logic regions similar to those found in the APE® family of programmable logic devices sold by Altera Corporation, of San Jose, Calif., the assignee hereof. In summary, those logic regions include, at the most basic level, "logic elements" (LEs) 11, which may be, for example, look-up table-based logic regions having four inputs and the ability to have registered or unregistered output. Logic elements 11 may be grouped into "logic array blocks" (LABs) 12. In the embodiment shown, each LAB 12 includes ten LEs 11, although other numbers of LEs 11 could be,grouped into each LAB 12. The LABs may further be grouped into "groups of LABs" (GOLs) 13. In the embodiment shown, each GOL 13 includes seventeen LABs 12, although other numbers of LABs 12 could be grouped into each GOL 13. Each GOL 13 preferably also includes an embedded memory block (referred to in the embodiment shown as an "embedded system block" or ESB) 14. Each GOL 13 preferably also includes a strip 15 of auxiliary gates, which may be used, e.g., for buffering of particular signals, as described below.

As shown, the GOLs 13 preferably are arranged in an orthogonal array, in rows and columns. Input/output ("I/O") elements preferably are located in regions 16 around the periphery of the array. Other auxiliary circuits, such as phase-locked loops ("PLLs") for clock generation and timing, etc., preferably are provided at convenient locations within the array, such as in region 17, shown in about the center of the array.

Figure 2:
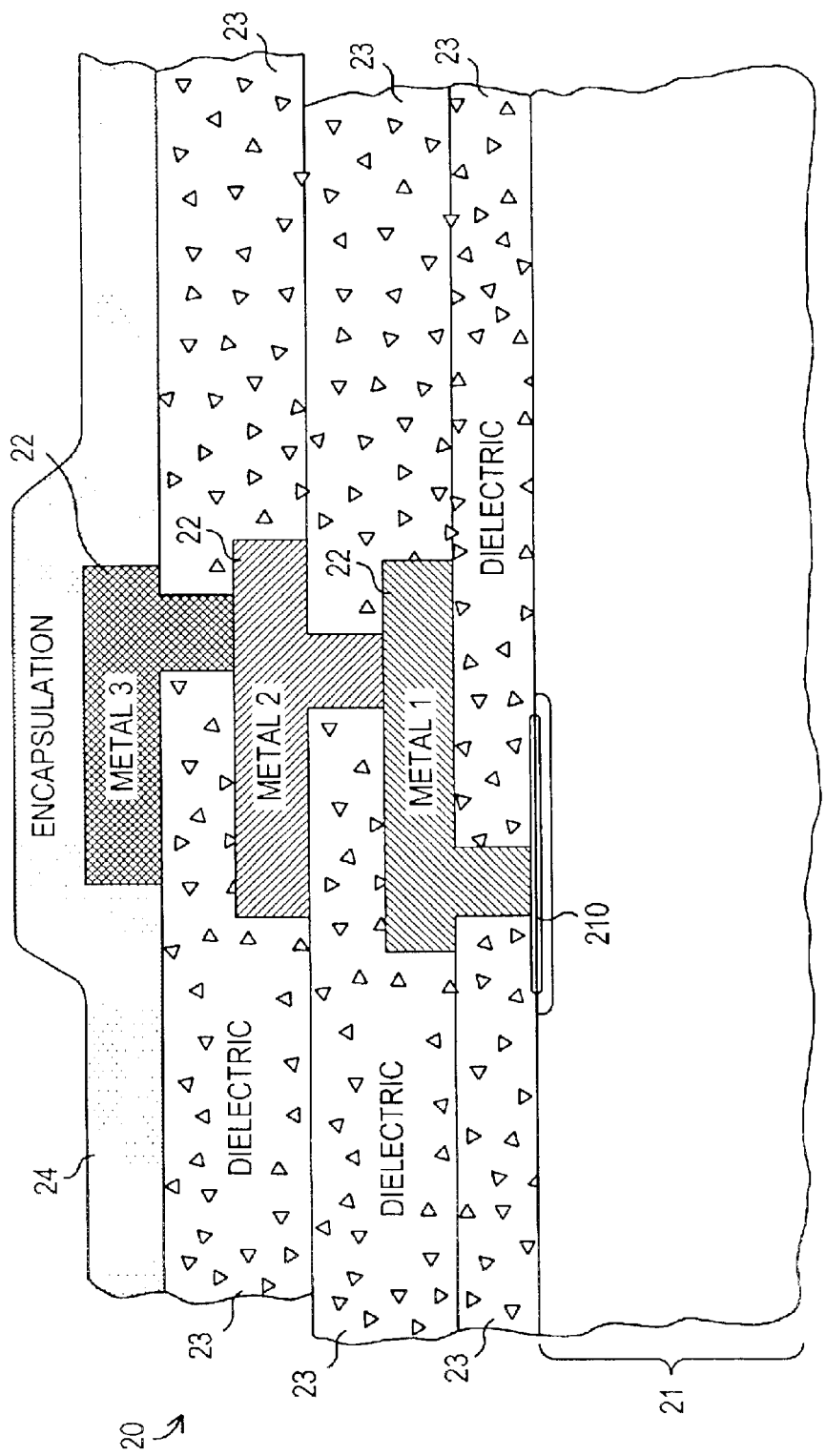
FIG. 2 is a schematic cross-sectional representation of a mask-programmed device according to the present invention, incorporating the device of FIG. 1.

FIG. 2 shows a cross section of mask-programmable or "base" device 10 after programming—i.e., after it has become a "mask-programmed" device 20, in which the substrate and other layers that make up the unprogrammed base device 10 are shown collectively at 21 (one transistor 210 is shown as representative). Additional layers of metallization 22 and dielectric 23 are used to program device 20 and create the custom distribution networks for secondary clocks and similar signals and high-fanout signals in accordance with the present invention, in addition to completing the device-wide network by providing conductors to connect the components included in base device 10 for the device-wide network (see FIG. 3). Commonly, an encapsulation layer 24 is provided to protect metallization and dielectric layers 22, 23.

Figure 3:
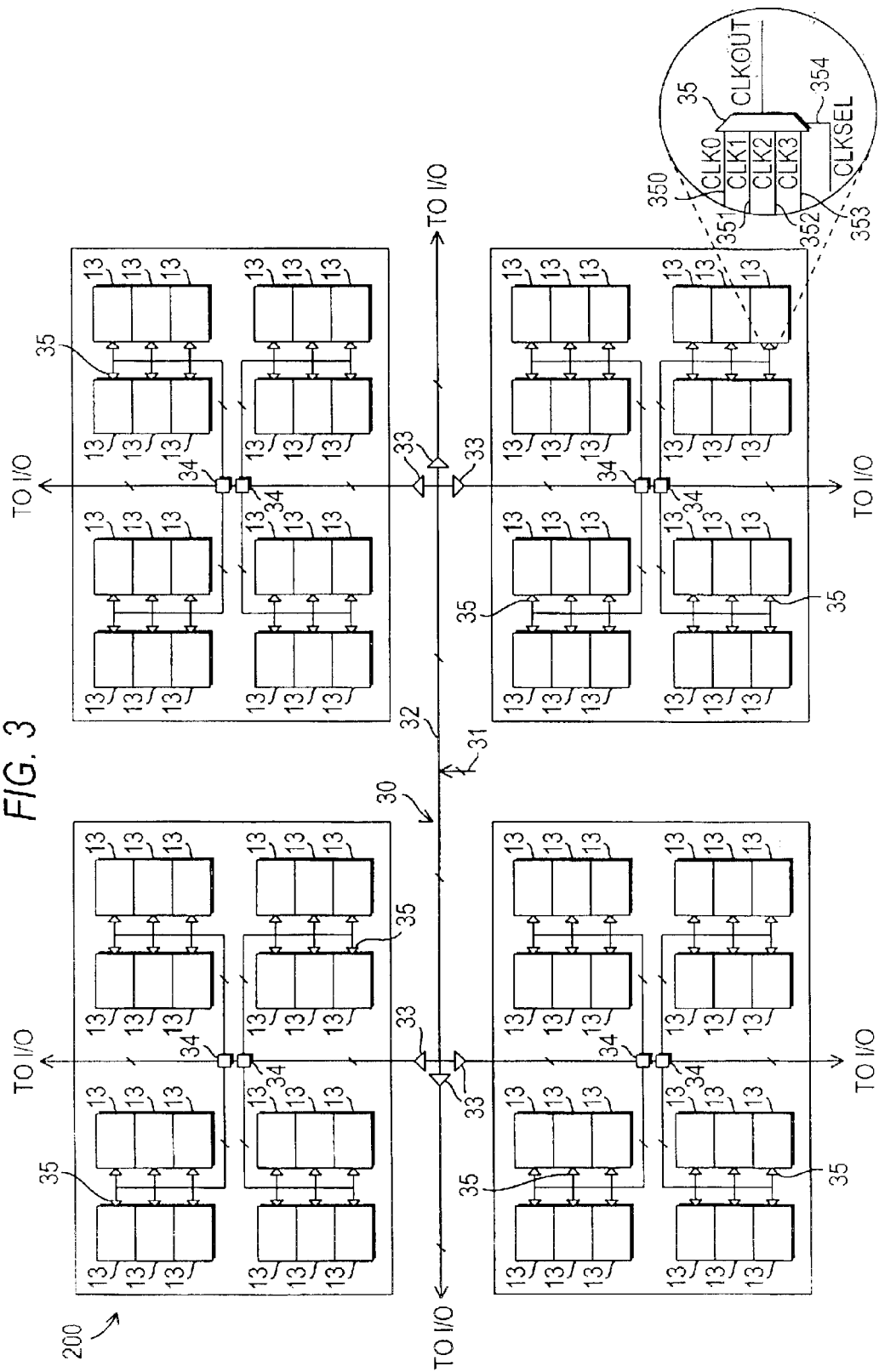
FIG. 3 is a schematic representation of the logic core of the device of FIG. 1, showing a device-wide signal distribution network.

FIG. 3 shows the logic core 200 of device 20, without I/O region 16 or PLL region 17, but with dedicated distribution network 30 for device-wide clocks. As shown, in a preferred embodiment distribution network 30 is arranged in an "H-tree" configuration to predetermine insertion delay and minimize skew. The signals preferably are introduced substantially in the center of the logic core of device 20 at insertion point 31, and preferably travel substantially horizontally along crossbar 32 of the H-tree. Preferably, after buffering by buffers 33, the signals preferably travel horizontally to I/O regions 16, and vertically to buffers 34, each of which preferably is located about midway between a respective buffer 33 and an I/O region 16. All signals have up to this point traveled substantially similar distances from insertion point 31 without reaching any particular GOL 13. At this point, the signals preferably travel vertically to I/O regions 16, as well as horizontally and then vertically to the various GOLs 13. Between buffers 34 and the various GOLs 13 the signals travel slightly different distances, but the skew introduced by such differences is small, and moreover is uniform over the four quadrants (in this embodiment) of device 10. The skew is certainly less than would occur if the insertion point were at an edge of device 20.

At each respective GOL 13, a respective multiplexer 35 preferably allows selection of one of several signals for entry into the respective GOL 13. As shown in FIG. 3, multiplexer 35 selects from among four clock signals 350–353. The selection at multiplexer 35 is made under control of a clock-select signal 354, which preferably is applied according to the mask programming of device 10 pursuant to the user design being implemented to form device 20.

Figure 4:
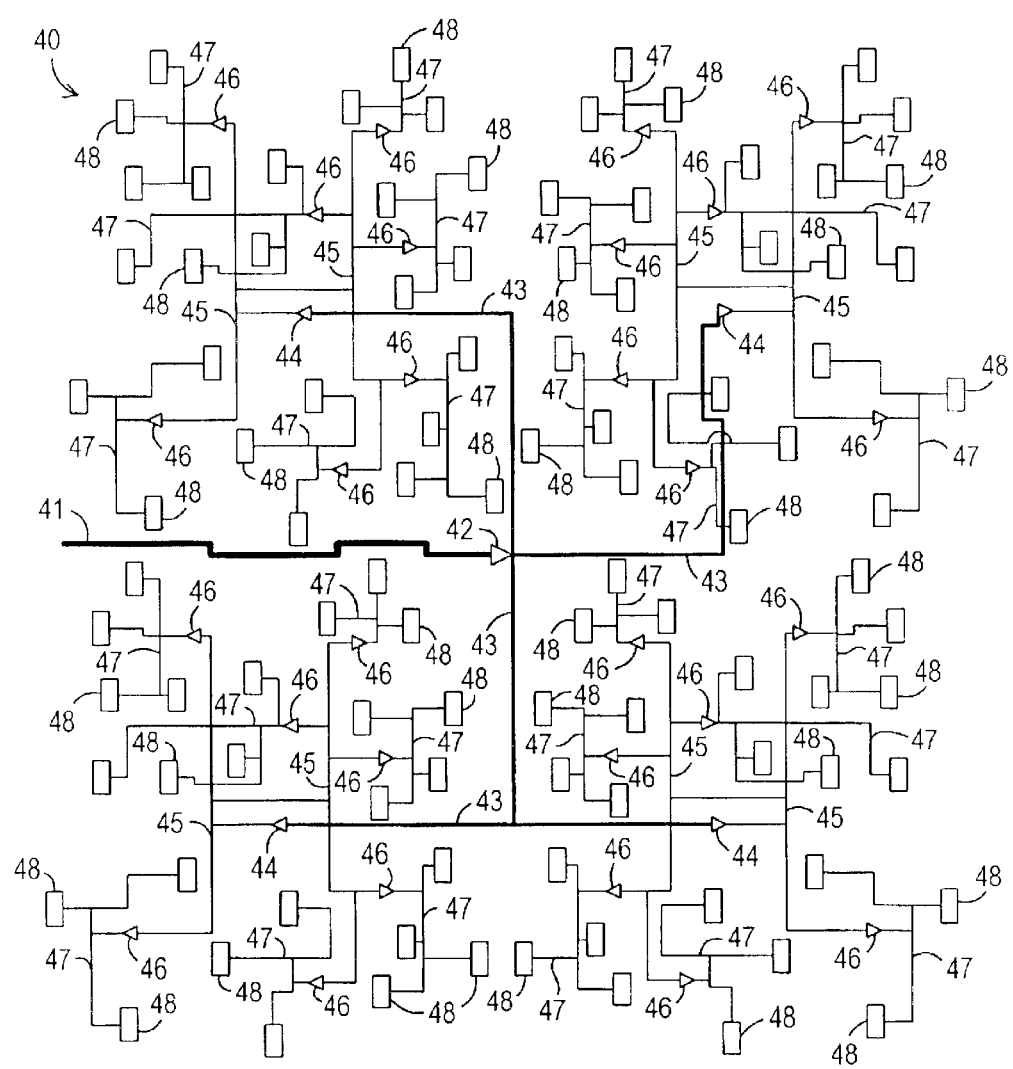
FIG. 4 is a schematic diagram of a representative custom signal distribution network in accordance with the invention.

During that mask-programming process, a custom distribution network for secondary clocks and/or high-fanout signals, such as distribution network 40 of FIG. 4, is laid out. The particular network 40 shown in FIG. 4 is only an example of the type of distribution network that might be provided. The distribution network in any case ordinarily is tailored to the particular user design being implemented, and is laid out using techniques that are well known in ASIC design. The objective is similar to that of device-wide distribution network 30—i.e., to minimize skew by equalizing, to the extent possible, the distances and buffering that signals pass through to reach particular components of device 10.

In FIG. 4, the thickness of the distribution network lines is different for different levels of network 40. Thus, the thickest line 41 shows where signals are inserted, and along which they travel to N-2 nd stage buffer 42. From there, next level conductors 43 conduct the signals to N-1st stage buffers 44. The distances from buffer 42 to each buffer 44 are selected to be about the same. A next level of conductors 45 conduct the signals to Nth stage buffers 46 and the final level of conductors 47 conduct the signals to elements 48 (representative ones labelled). The various buffers 42, 44, 46, etc. may be constructed from the auxiliary gates 15 described above.

Although FIG. 4 shows a three-stage network, the number of stages in any particular custom distribution network according to the invention will depend on many factors including the particular user configuration being implemented and the size of device 10, including the number of elements 48.

By limiting the custom layout required to that needed for the secondary distribution network 40, with device-wide network 30 being standard for all user configurations of a particular model of device 10, the design time for implementing any user configuration is minimized, because no design time is required for device-wide network 30. In addition, network 30 can be designed to preserve the timing characteristics of the conventional programmable logic device on which the user configuration was proved (it being understood that a manufacturer will provide each base device 10, and programming design services for such a device 10, as a counterpart to a conventional programmable logic device that it also provides). At the same time, the custom design of network 40 means that the area required for network 40 can be minimized, reducing the die size requirements for comparable functionality, and thus reducing power requirements, as compared to the counterpart conventional programmable logic device.

Figure 5:
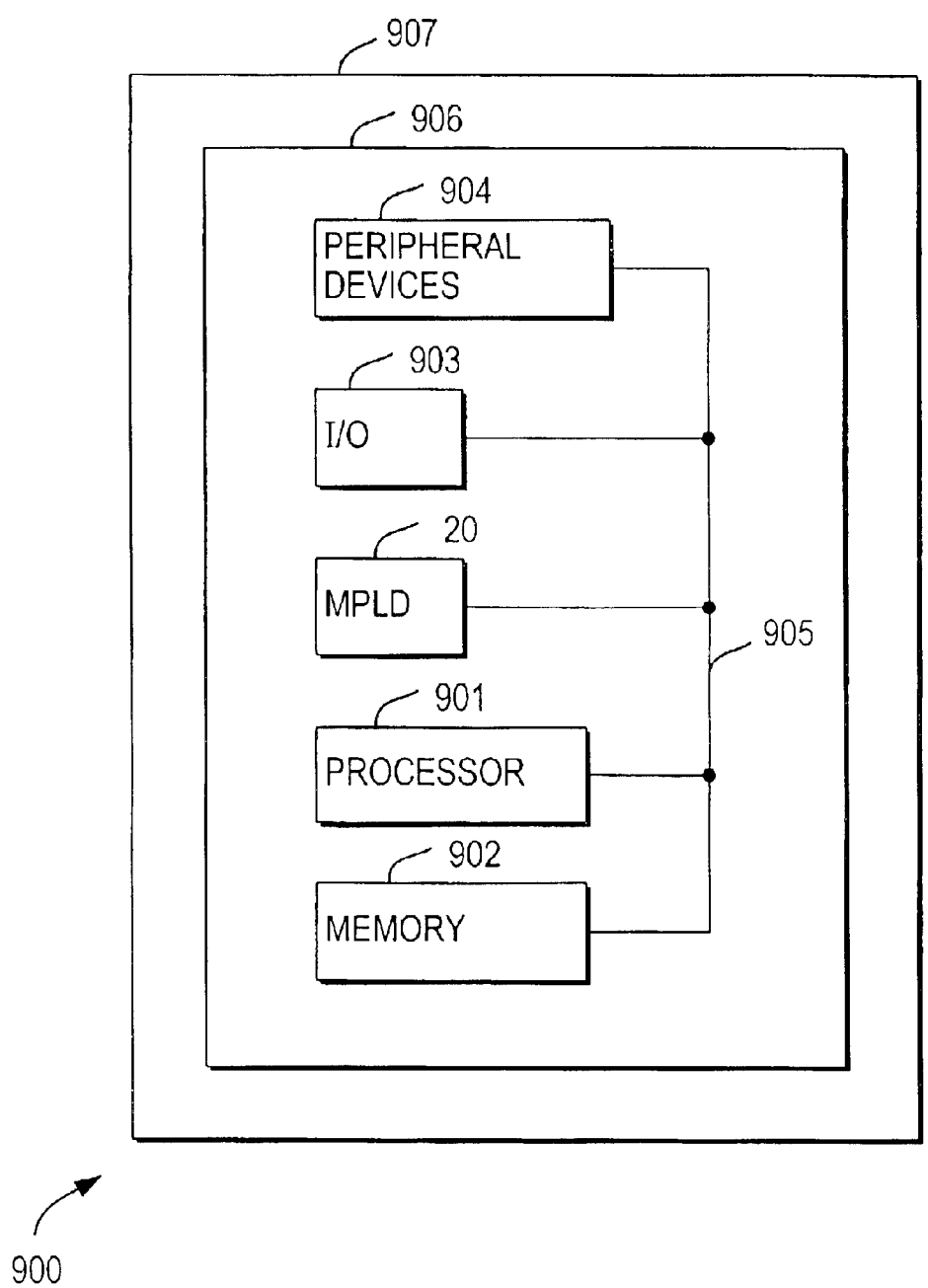
FIG. 5 is a simplified block diagram of an illustrative system employing a programmable logic device in accordance with the invention.

Mask-programmed device 20 based on mask-programmable logic device 10 as described above may be used as part of a data processing system 900 shown in FIG. 5. Data processing system 900 may include one or more of the following components: a processor 901; memory 902; I/O circuitry 903; and peripheral devices 904. These components are coupled together by a system bus 905 and are populated on a circuit board 906 which is contained in an end-user system 907.

System 900 can be used in a wide variety of applications, such as computer networking, data networking, instrumentation, video processing, digital signal processing, or any other application where the advantage of using mask-programmable logic is desirable. Mask-programmable logic device 10 can be configured to perform a variety of different logic functions. For example, mask-programmable logic device 10 can be configured as a processor or controller that works in cooperation with processor 901. Mask-programmed logic device 20 may also be used as an arbiter for arbitrating access to a shared resources in system 900. In yet another example, mask-programmed logic device 20 can be configured as an interface between processor 901 and one of the other components in system 900. It should be noted that system 900 is only exemplary, and that the true scope and spirit of the invention should be indicated by the following claims.

Various technologies can be used to implement mask-programmable logic devices 10 as described above according to this invention.

It will be understood that the foregoing is only illustrative of the principles of the invention, and that various modifications can be made by those skilled in the art without departing from the scope and spirit of the invention, and the present invention is limited only by the claims that follow.

What is claimed is:

1. A mask-programmed logic device comprising:
   a mask-programmable base device including:
   an array of mask-programmable logic regions,
   a plurality of input/output areas, and
   a plurality of drivers for a device-wide network for distribution of device-wide signals among said logic regions and said input/output areas; and
   programming metallization layers that: (a) program said mask-programmable logic regions, (b) connect said plurality of drivers to form said device-wide network, and (c) provide interconnections between and among said mask-programmed logic areas and said input/output areas; wherein:

said interconnections provided by said programming metallization layers include routing for high-fanout signals;

said device-wide network is optimized for said base device, independent of programming, to minimize skew of said device-wide signals; and said routing for high-fanout signals is optimized for said device as programmed by said programming metallization layers.

2. The mask-programmed logic device of claim 1 wherein:

said mask-programmable base device further includes clock generation logic; and said device-wide signals comprise at least one clock signal.

3. The mask-programmed logic device of claim 2 wherein said clock generation logic comprises at least one phase-locked loop circuit.

4. The mask-programmed logic device of claim 2 wherein said high-fanout signals comprise signals selected from the group consisting of one or more secondary clock signals, one or more preset signals, one or more clear signals, one or more enable signals and one or more high-fanout logic outputs.

5. The mask-programmed logic device of claim 1 wherein said high-fanout signals comprise signals selected from the group consisting of one or more secondary clock signals, one or more preset signals, one or more clear signals, one or more enable signals and one or more high-fanout logic outputs.

6. The mask-programmed logic device of claim 1 wherein:

said mask-programmable base device further comprises at least one auxiliary gate associated with each of at least some of said mask-programmable logic regions; and at least one of said at least one auxiliary gate buffers one of said high-fanout signals onto a conductor in said routing for high-fanout signals.

7. A mask-programmable logic device comprising:

an array of mask-programmable logic regions;

a plurality of input/output areas; and a plurality of drivers for a device-wide network for distribution of device-wide signals among said logic regions and said input/output areas; wherein:

said device-wide network is optimized for said base device, independent of programming, to predetermine insertion delay and minimize skew of said device-wide signals.

8. The mask-programmable logic device of claim 7, further comprising clock generation logic; wherein:

said device-wide signals comprise at least one clock signal.

9. The mask-programmable logic device of claim 8 wherein said clock generation logic comprises at least one phase-locked loop circuit.

10. The mask-programmable logic device of claim 7 wherein:

said mask-programmable logic regions are adapted to be programmed by at least one metallization layer;

said plurality of drivers are adapted to be interconnected by conductors in at least one metallization layer to form said device-wide network; and said mask-programmable logic regions and said input/output regions are adapted to be interconnected by conductors in at least one metallization layer.

11. The mask-programmable logic device of claim 10 further comprising at least one auxiliary gate associated with each of at least some of said mask-programmable logic regions; wherein:

at least one of said at least one auxiliary gate is adapted to buffer a signal from one of said mask-programmable logic regions onto one of said conductors in said at least one metallization layer.

12. The mask-programmable logic device of claim 7 further comprising at least one auxiliary gate associated with each of at least some of said mask-programmable logic regions; wherein:

at least one of said at least one auxiliary gate is adapted to buffer a signal output by one of said mask-programmable logic regions.

13. A method of programming a mask-programmable logic device, said method comprising:

providing a mask-programmable base device including:

an array of mask-programmable logic areas, a plurality of input/output areas, and a plurality of drivers for a device-wide network for distribution of device-wide signals among said logic areas and said input/output areas; and applying programming metallization layers that (a) program said mask-programmable logic areas, (b) connect said plurality of drivers to form said device-wide network, and (c) provide interconnections between and among said mask-programmed logic areas and said input/output areas; wherein:

said interconnections provided by said programming metallization layers include routing for high-fanout signals; and said device-wide network is optimized for said base device, independent of programming, to predetermine insertion delay and minimize skew of said device-wide signals; said method further comprising:

optimizing said routing for high-fanout signals for said device as programmed by said programming metallization layers.

14. The method of claim 13 wherein:

said providing comprises providing a mask-programmable base device further including clock generation logic; and said device-wide signals comprise at least one clock signal.

15. The method of claim 14 wherein said providing a mask-programmable base device further including clock generation logic comprises-providing a mask-programmable base device including at least one phase-locked loop circuit.

16. The method of claim 14 wherein said high-fanout signals comprise signals selected from the group consisting of one or more secondary clock signals, one or more preset signals, one or more clear signals, one or more enable signals and one or more high-fanout logic outputs.

17. The method of claim 16 further comprising buffering one of said high-fanout signals onto a conductor in said routing for high-fanout signals.

18. The method of claim 13 wherein said high-fanout signals comprise signals selected from the group consisting of one or more secondary clock signals, one or more preset signals, one or more clear signals, one or more enable signals and one or more high-fanout logic outputs.

19. The method of claim 18 further comprising buffering one of said high-fanout signals onto a conductor in said routing for high-fanout signals.

20. The method of claim 13 further comprising buffering one of said high-fanout signals onto a conductor in said routing for high-fanout signals.

21. A method of predetermining insertion delay and minimizing skew in a mask-programmable logic device, said method comprising:

providing a mask-programmable base device including:

an array of mask-programmable logic areas, a plurality of input/output areas, and a plurality of drivers for a device-wide network for distribution of device-wide signals among said logic areas and said input/output areas, said device-wide network being optimized for said base device, independent of programming, to predetermine insertion delay and minimize skew of said device-wide signals; and adding, to said base device, programming metallization layers that: (a) program said mask-programmable logic regions, (b) connect said plurality of drivers to form said device-wide network, and (c) provide interconnections between and among said mask-programmed logic areas and said input/output areas, including providing routing for high-fanout signals; wherein:

said adding comprises optimizing, for said device as programmed by said programming metallization layers, said routing for high-fanout signals.

22. The method of claim 21 wherein:

said providing comprises providing a mask-programmable base device further including clock generation logic; and said device-wide signals comprise at least one clock signal.

23. The method of claim 22 wherein said providing a mask-programmable base device further including clock generation logic comprises providing a mask-programmable base device including at least one phase-locked loop circuit.

24. The method of claim 22 wherein said high-fanout signals comprise signals selected from the group consisting of one or more secondary clock signals, one or more preset signals, one or more clear signals, one or more enable signals and one or more high-fanout logic outputs.

25. The method of claim 24 further comprising buffering one of said high-fanout signals onto a conductor in said routing for high-fanout signals.

26. The method of claim 21 wherein said high-fanout signals comprise signals selected from the group consisting of one or more secondary clock signals, one or more preset signals, one or more clear signals, one or more enable signals and one or more high-fanout logic outputs.

27. The method of claim 26 further comprising buffering one of said high-fanout signals onto a conductor in said routing for high-fanout signals.

28. The method of claim 21 further comprising buffering one of said high-fanout signals onto a conductor in said routing for high-fanout signals.

29. A digital processing system comprising:

processing circuitry;

a memory coupled to said processing circuitry; and a mask-programmed logic device as defined in claim 1 coupled to the processing circuitry and the memory.

30. A printed circuit board on which is mounted a mask-programmed logic device as defined in claim 1.

31. The printed circuit board defined in claim 30 further comprising:

memory circuitry mounted on the printed circuit board and coupled to the mask-programmed logic device.

32. The printed circuit board defined in claim 31 further comprising:

processing circuitry mounted on the printed circuit board and coupled to the memory circuitry.

33. A digital processing system comprising:

processing circuitry;

a memory coupled to said processing circuitry; and a programmed mask-programmable logic device as defined in claim 7 coupled to the processing circuitry and the memory.

34. A printed circuit board on which is mounted a programmed mask-programmable logic device as defined in claim 7.

35. The printed circuit board defined in claim 34 further comprising:

memory circuitry mounted on the printed circuit board and coupled to the programmed mask-programmable logic device.

36. The printed circuit board defined in claim 35 further comprising:

processing circuitry mounted on the printed circuit board and coupled to the memory circuitry.

* * * * *